United States Patent [19]

Gallup

[11] Patent Number: 4,569,067

[45] Date of Patent: Feb. 4, 1986

[54] DUAL MASTER SHIFT REGISTER BIT

[75] Inventor: Michael G. Gallup, Austin, Tex.

[73] Assignee: Motorola, Inc., Schaumburg, Ill.

[21] Appl. No.: 520,360

[22] Filed: Aug. 4, 1983

[51] Int. Cl.$^4$ .................... G11C 19/00; H03K 3/284
[52] U.S. Cl. ........................... 377/79; 377/81; 307/272 A
[58] Field of Search ............... 307/272 A; 377/77, 70, 377/73, 78, 74, 81, 79, 115, 116, 117

[56] References Cited

U.S. PATENT DOCUMENTS

| | | | |
|---|---|---|---|
| 3,268,740 | 8/1966 | Rywak | 307/272 A |
| 3,917,961 | 11/1975 | Reed | 307/272 A |
| 4,495,628 | 1/1985 | Zasio | 377/70 |
| 4,495,629 | 1/1985 | Zasio et al. | 377/73 |

*Primary Examiner*—John S. Heyman
*Assistant Examiner*—Timothy P. Callahan
*Attorney, Agent, or Firm*—Anthony J. Sarli, Jr.; Jeffrey Van Myers; James L. Clingan, Jr.

[57] ABSTRACT

A shift register bit with first and second masters and a slave receives clocked data on the first master from two inputs. After data has been received by the first master, data is coupled from the first master to the second master. In the event that both clocked inputs are operative, the second master is coupled to the slave. One of the inputs is given priority. The other input is disabled. At a predetermined time the second master is decoupled from the slave and the first master is coupled back to the slave.

11 Claims, 2 Drawing Figures

DUAL MASTER SHIFT REGISTER BIT

FIELD OF THE INVENTION

The subject invention relates to shift register bits, and more particularly to shift register bits with two independently clocked inputs.

BACKGROUND OF THE INVENTION

In microcomputer systems there are often two or more independent operations occurring at the same time. These operations may be monitored and/or controlled by a single processor. In such a case there are priorities assigned to the various operations. It is important that data involving high priority operations not be lost in the situations where conflicts exist between operations. Circuitry for implementing such prioritizing systems is typically quite involved. Circuitry which can be useful in such priority systems is, consequently, desirable.

SUMMARY OF THE INVENTION

An object of the subject invention is to provide an improved shift register bit.

Another object of the invention is to provide a dual master shift register bit for improved usefulness in a priority system.

Yet another object of the invention is to provide an improved shift register bit which has two independently clocked inputs.

These and other objects are achieved by a shift register bit having a first master, a second master, and a slave. A first input signal is coupled to the first master when a first clock signal is present. Data is coupled from the first master to the slave when the first clock signal is absent. Data is coupled from the first master to the second master after the first master has received data. A second input signal is coupled to the first master when a second clock signal is present. Data is coupled from the second master to the slave in response to the first clock signal occurring while the second clock signal is present.

DESCRIPTION OF A PREFERRED EMBODIMENT

Figure 1:
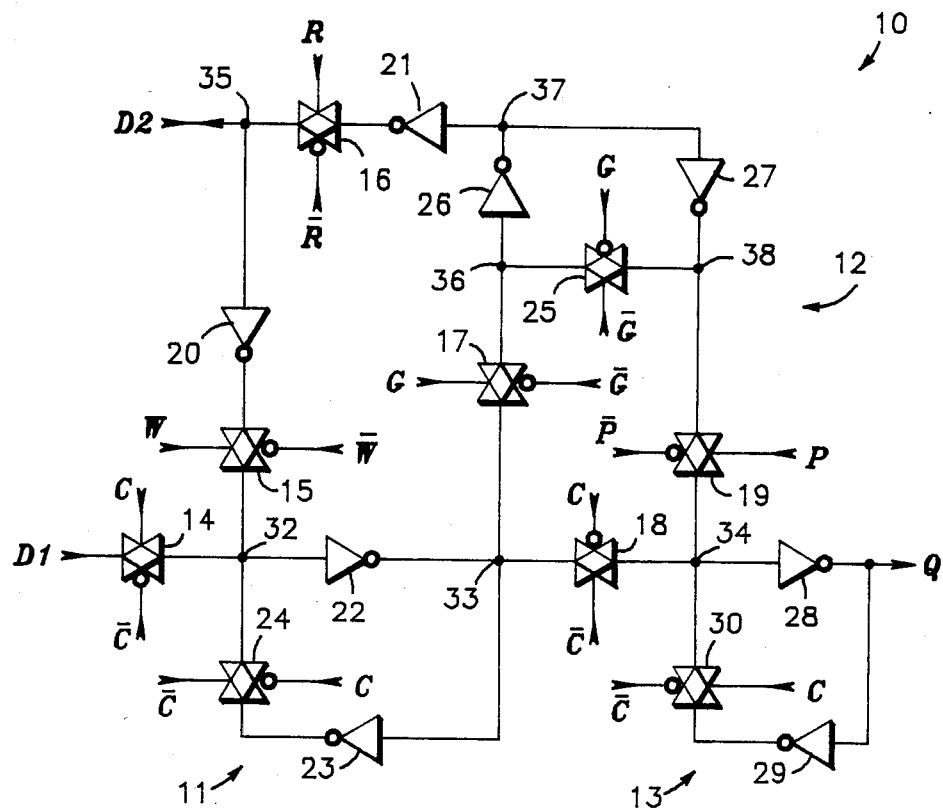
FIG. 1 is a dual master shift register bit according to a preferred embodiment of the invention.

Shown in FIG. 1 is a dual master shift register bit 10 comprised generally of a first master latch 11, a second master latch 12, a slave latch 13, a transmission gate 14, a transmission gate 15, a transmission gate 16, a transmission gate 17, a transmission gate 18, a transmission gate 19, an inverter 20, and an inverter 21. Latch 11 comprises an inverter 22, an inverter 23 and a transmission gate 24. Latch 12 comprises a transmission gate 25, an inverter 26, and an inverter 27. Latch 13 comprises an inverter 28, an inverter 29, and a transmission gate 30. Transmission gates 14–19, 24, 25 and 30 can be, for example, conventional CMOS transmission gates. Inverters 20–23 and 26–29 can be, for example, conventional CMOS inverters.

Transmission gates 14–19, 24, 25, and 26 each have true and inverted clock inputs and first and second terminals. Signals received by the true and inverted clock inputs are complements of each other. When the true clock input is at a logic high, a conductive path is formed between the first and second terminals. Otherwise, an open circuit is provided between the first and second terminals. In this regard the true and inverted clock inputs of transmission gates 14 and 30 receive a signal C and the complement thereof, respectively, whereas the inverted and true clock inputs of transmission gates 18 and 24 receive signal C and the complement thereof, respectively. Consequently, when signal C is a logic high, transmission gates 14 and 30 are conducting while transmission gates 18 and 24 are non-conducting, and when signal C is a logic low, transmission gates 18 and 24 are conducting while transmission gates 14 and 30 are non-conducting. The true and inverted clock inputs of transmission gate 15 receive a signal W and the complement thereof, respectively. The true and inverted clock inputs of transmission gate 16 receive a signal R and the complement thereof, respectively. The true and inverted clock inputs of transmission gate 17 receive a signal G and the complement thereof, respectively. The inverted and true clock inputs of transmission gate 25 receive signal G and the complement thereof, respectively. The true and inverted clock inputs of transmission gate 19 receive a signal P and the complement thereof, respectively.

Gate 14 has a first terminal for receiving an input signal D1, and a second terminal connected to a node 32. Inverter 22 has an input connected to node 32, and an output connected to a node 33. Inverter 23 has an input connected to node 33, and an output. Transmission gate 24 has a first terminal connected to the output of inverter 23, and a second terminal connected to node 32. Transmission gate 18 has a first terminal connected to node 33, and a second terminal connected to a node 34. Inverter 28 has an input connected to node 34, and an output for providing an output signal Q. Inverter 29 has an input connected to the output of inverter 28, and an output. Transmission gate 30 has a first terminal connected to the output of inverter 29, and a second terminal connected to node 34.

Inverter 20 has an input connected to a node 35 for receiving a signal D2, and an output. Transmission gate 15 has a first terminal connected to the output of inverter 20, and a second terminal connected to node 32. Transmission gate 17 has a first terminal connected to node 33, and a second terminal connected to a node 36. Inverter 26 has an input connected to node 36, and an output connected to a node 37. Inverter 27 has an input connected to node 37, and an output connected to a node 38. Transmission gate 25 has a first terminal connected to node 38, and a second terminal connected to node 36. Transmission gate 19 has a first terminal connected to node 38, and a second terminal connected to node 34. Inverter 21 has an input connected to node 37, and an output. Transmission gate 16 has a first terminal connected to the output of inverter 21, and a second terminal connected to node 35.

Latches 11 and 13 and transmission gates 14 and 18 form a conventional negative-edge-triggered D flip-flop with latch 11 being a master and latch 13 being a slave. When signal C is a logic high, transmission gate 14 is conducting so that signal D1 is received by latch 11 at node 32. Inverter 22 is responsive to signal D1. Latch 13 remains unaffected until signal C switches to a logic low which causes transmission gates 18 and 24 to be conductive while causing transmission gates 14 and 30 to be non-conductive. Latch 13 is then responsive to the logic state at node 33 while the logic states at nodes 32 and 33 are latched by inverter 23.

Figure 2:
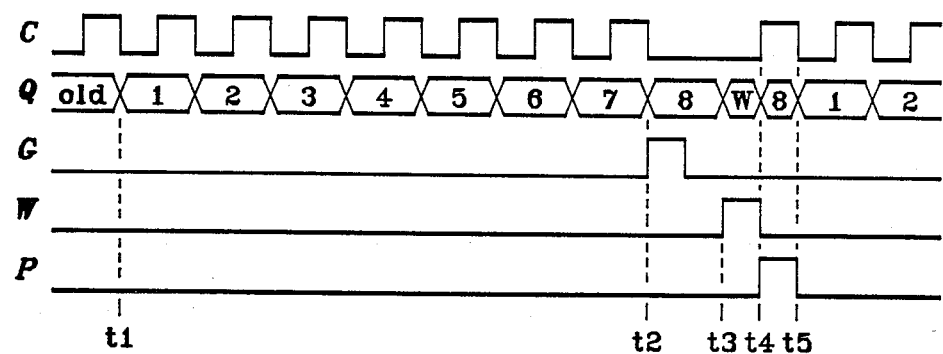
FIG. 2 is a timing diagram of signals used in the shift register bit of FIG. 1.

Shown in FIG. 2 is a timing diagram of signals C, Q, G, W and P. Between times t1 and t2 is shown conventional D flip-flop operation useful, for example, for serially shifting data. For each transition of a logic high to a logic low new valid data is provided by signal Q. Upon completion of a transmission of data shown at time t2, signal G switches to a logic high. Such a signal is generally readily available. A signal which indicates that a transmission has been completed, for example, can be used. When signal G switches to a logic high, transmission gate 17 conducts the logic state latched on node 33 to latch 12 at node 36. When signal G switches back to a logic low, transmission gate 25 becomes conductive so that the logic state of latch 11 is latched on nodes 36 and 38. Latch 12 thus provides storage of the logic state representative of the last logic state of the last transmission. Latch 11 can also receive signal D2 via inverter 20 and transmission gate 15 when signal W is a logic high. In such a case inverter 22 will respond and in turn drive inverter 28 because transmission gate 18 is conducting. Consequently, signal Q is responsive to signal D2 when signal W is a logic high which is the desired result.

The problem arises when signal C switches to a logic high after signal W has already switched to a logic high. This is a conflict which must be resolved when signals C and W are asynchronous. For the embodiment shown, data represented by signal D1 and clocked by signal C has priority. The conflict is resolved as shown in FIG. 2. Signal W switches to a logic high at time t3 so that signal Q is responsive to signal D2. The data stored in latch 11 prior to signal W switching to a logic high is consequently destroyed. Signal C then switches to a logic high, creating the conflict. In response to signal W and signal C both being a logic high, signal P is switched to a logic high for a period of time by any conventional means. Signal W is pulled to a logic low in response to the conflict by any conventional means. Latch 11 is then responsive to only signal D1 because transmission gate 15 is non-conducting. With signal C at a logic high, transmission gate 18 isolates latch 13 from latch 11. With signal P at a logic high, the logic state at node 38 is coupled to latch 13 at node 34. Signal Q is then responsive to the logic state stored in latch 12 which acts as a second master. Because signal latch 12 stores the last valid data from a negative transition of signal C, signal Q is then at the same logic state as if there had been no intervening input from signal D2 as a result of signal W switching to a logic high. Consequently, the starting condition for the next transmission is known. Additionally, that the condition is the last valid data from the last transmission clocked by signal C is of critical importance for the situation in which shift register bit 10, is one of a chain for serially shifting data.

For example, if there is a series chain of eight shift register bits for serial transmission of a byte of data, a whole byte of data is resident at any one time in the shift register. Each new transmission of a byte is the previously resident byte. Consequently, for each shift register bit in the chain, each output must begin with the data received on the previous negative transition of signal C.

Shift register bit 10 also has a read mode. When signal R switches to a logic high, signal D2 is provided as an output responsive to the logic state of latch 12. Inverter 21 isolates node 37 from the capacitance at node 35.

Inverter 20 is provided to make an even number of inverters in the path from node 35 to node 32, to node 33, to node 36, to node 37, and back to node 35.

While the invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

I claim:

1. In a shift register bit which controllably clocks data from an input to an output and which has a first master latch, a second master latch, and a slave latch, each latch having an input and an output, a method for providing, under the control of a plurality of clock signals, data in the form of an output signal at the output responsive to data in the form of an input signal received at the input comprising the steps of:

coupling the input signal from the input of the shift register bit to the input of the first master latch in response to a first clock signal switching to a first logic state and providing the data represented by the input signal on the output of the first master latch;

latching the data represented by the input signal in the first master latch in response to the first clock signal switching to a second logic state and providing the data latched in the first master latch at the output of the first master latch;

coupling the data latched in the first master latch from the output of the first master latch to the input of the slave latch in response to the first clock signal switching to the second logic state and providing the data received at the input of the slave latch at the output of the slave latch as the output of the shift register bit;

coupling the output of the first master latch to the input of the second master latch in response to a second clock signal switching to the first logic state;

latching the data received by the input of the second master latch in the second master latch in response to the second clock signal switching to the second logic state and providing the data latched in the second master latch on the output of the second master latch; and coupling the output of the second master latch to the input of the slave latch in response to a third clock signal switching to the first logic state.

2. The method of claim 1 further comprising the step of switching the second clock signal to the second logic state in response to the first clock signal switching to the first logic state.

3. The method of claim 2 wherein the third clock signal switches to the first logic state in response to the first clock signal switching to the first logic state while the second clock signal is in the first logic state.

4. The method of claim 3 further comprising the step of switching the third clock signal to the second logic state prior to the first clock signal switchng to the second logic state.

5. A shift register bit comprising:

a first switch for coupling a first input signal to an input node when a first clock signal is at a first logic level;

a second switch for coupling a second input signal to the input node when a second clock signal is at the first logic level;

a first latch having an input coupled to the input node, and an output;

a second latch having an input, and an output;

a third switch for coupling the output of the first latch to the input of the second latch when the first clock signal is at a second logic level;

a third latch having an input, and an output;

a fourth switch for coupling the output of the first latch to the input of the third latch when a third clock signal is at the first logic level;

a fifth switch for coupling the output of the third latch to the input of the second latch when a fourth clock signal is at the first logic level.

6. The shift register bit of claim 5 wherein the fourth clock signal occurs in response to the first clock signal switching to the first logic level while the second clock signal is at the first logic level.

7. The shift register bit of claim 6 wherein the fourth clock signal is switched to the second logic level prior to the first clock signal switching to the second logic level.

8. The shift register bit of claim 7 wherein the output of the first and second latches are inverted outputs, and the output of the third latch is a non-inverting output.

9. The shift register bit of claim 8 wherein the first, second, third, fourth, and fifth switches are CMOS transmission gates.

10. The shift register bit of claim 9 wherein the first, second, and third latches are clocked CMOS latches.

11. The shift register bit of claim 10 wherein the first latch receives the first clock signal and maintains a latched condition when the first clock signal is at the second logic level, wherein the second latch receives the first clock signal and maintains a latched condition when the first clock signal is at the first logic level, and wherein the third latch receives the third clock signal and maintains a latched condition when the third clock signal is at the second logic level.

* * * * *